(12) United States Patent
Dawson et al.

(10) Patent No.: US 9,250,663 B2
(45) Date of Patent: Feb. 2, 2016

(54) SYSTEM AND METHOD FOR DYNAMICALLY MODELING DATA CENTER PARTITIONS

(75) Inventors: Christopher J. Dawson, Arlington, VA (US); Vincenzo V. Diluoffo, Sandy Hook, CT (US); Rick A. Hamilton, II, Charlottesville, VA (US); Michael D. Kendzierski, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 2011 days.

(21) Appl. No.: 12/239,995

(22) Filed: Sep. 29, 2008

(65) Prior Publication Data

US 2010/0082309 A1    Apr. 1, 2010

(51) Int. Cl.
| | | |
|---|---|---|
| *G06G 7/48* | (2006.01) | |
| *G06G 7/56* | (2006.01) | |
| *G06F 1/20* | (2006.01) | |
| *H05K 7/20* | (2006.01) | |

(52) U.S. Cl.
CPC ........ *G06F 1/206* (2013.01); *G06F 1/20* (2013.01); *H05K 7/20836* (2013.01); *Y02B 60/1275* (2013.01)

(58) Field of Classification Search
USPC .................................... 703/5; D23/325, 333
See application file for complete search history.

(56) References Cited

U.S. PATENT DOCUMENTS

| | | |
|---|---|---|
| 2,751,198 A | 6/1956 | Rapp |
| 3,516,347 A | 6/1970 | May |
| 3,690,243 A | 9/1972 | Lambert |
| 3,757,666 A | 9/1973 | Lambert |
| 3,835,606 A | 9/1974 | Liberman |
| 3,986,850 A | 10/1976 | Wilcox |
| 4,353,411 A | 10/1982 | Harter et al. |
| 4,646,500 A | 3/1987 | Smith |
| 4,676,144 A | 6/1987 | Smith, III et al. |
| 4,783,943 A | 11/1988 | Ljungkvist |
| 4,996,810 A | 3/1991 | Forde |
| 5,107,687 A | 4/1992 | Candeloro |
| 5,165,465 A | 11/1992 | Kenet |
| 5,167,575 A | 12/1992 | MacDonald |

(Continued)

FOREIGN PATENT DOCUMENTS

EP           614088         9/1994

OTHER PUBLICATIONS

Chiang et al., Integration of Supervisory and Nonlinear Control for a Heating, Ventilating, and Air Conditioning System, Apr. 2005, IEEE, pp. 544-549.*

(Continued)

*Primary Examiner* — Omar Fernandez Rivas
*Assistant Examiner* — Bernard E Cothran
(74) *Attorney, Agent, or Firm* — John Pivnichny; Roberts Mlotkowski Safran & Cole, P.C.

(57) ABSTRACT

A method implemented in a computer infrastructure having computer executable code tangibly embodied on a computer readable medium having programming instructions operable to perform a thermal analysis of a data center and overlay the thermal analysis on a map of the data center to provide an overlaid thermal analysis. Additionally, the programming instructions are operable to receive a user selection of at least one modeled partition location based on the overlaid thermal analysis and dynamically model a modeled partition for each of the at least one modeled partition location in the data center to create a modeled data center region.

2 Claims, 6 Drawing Sheets

(56) References Cited

U.S. PATENT DOCUMENTS

| | | |
|---|---|---|
| 5,263,289 A | 11/1993 | Boyd |
| 5,394,324 A | 2/1995 | Clearwater |
| 5,467,607 A | 11/1995 | Harvey |
| 5,477,698 A | 12/1995 | Takegawa et al. |
| 5,490,357 A | 2/1996 | Lin |
| 5,544,036 A | 8/1996 | Brown et al. |
| 5,778,612 A | 7/1998 | Kissinger et al. |
| 5,842,313 A | 12/1998 | Murray et al. |
| 5,992,108 A | 11/1999 | Falcey |
| 6,003,273 A | 12/1999 | Elsholz et al. |
| 6,033,301 A | 3/2000 | Suwa |
| 6,202,360 B1 | 3/2001 | Rattner et al. |
| 6,557,624 B1 | 5/2003 | Stahl et al. |
| 6,604,993 B1 | 8/2003 | Boniface |
| 6,832,490 B2 | 12/2004 | Bash et al. |
| 6,862,179 B2 | 3/2005 | Beitelmal et al. |
| 6,885,115 B2 | 4/2005 | Hatori et al. |
| 6,991,533 B2 | 1/2006 | Tsai et al. |
| 6,996,940 B2 | 2/2006 | Beasley |
| 7,010,392 B2 | 3/2006 | Bash et al. |
| 7,214,131 B2 | 5/2007 | Malone |
| 7,228,664 B2 | 6/2007 | Clark |
| 7,259,963 B2 | 8/2007 | Germagian et al. |
| 7,266,964 B2 | 9/2007 | Vogel et al. |
| 7,304,477 B2 | 12/2007 | Konijn et al. |
| 7,856,370 B2 | 12/2010 | Katta et al. |
| 2001/0034987 A1 | 11/2001 | Cooper et al. |
| 2002/0174223 A1 | 11/2002 | Childers et al. |
| 2002/0189180 A1 | 12/2002 | King et al. |
| 2003/0085033 A1 | 5/2003 | Petterson |
| 2003/0097806 A1 | 5/2003 | Brown |
| 2003/0224717 A1 | 12/2003 | Tsai et al. |
| 2004/0035074 A1 | 2/2004 | Stanescu et al. |
| 2004/0183904 A1 | 9/2004 | Johnson |
| 2004/0236528 A1 | 11/2004 | Steinkirchner et al. |
| 2005/0159099 A1 | 7/2005 | Malone |
| 2005/0183353 A1 | 8/2005 | Haberman |
| 2005/0288812 A1 | 12/2005 | Cheng et al. |
| 2006/0015712 A1 | 1/2006 | Ang et al. |
| 2006/0015866 A1 | 1/2006 | Ang et al. |
| 2006/0073783 A1 | 4/2006 | Tsai et al. |
| 2006/0076425 A1 | 4/2006 | Demster |
| 2006/0168975 A1 | 8/2006 | Malone et al. |
| 2006/0250770 A1 | 11/2006 | Campbell et al. |
| 2006/0260338 A1 | 11/2006 | VanGilder et al. |
| 2007/0019380 A1 | 1/2007 | Campbell et al. |
| 2007/0062685 A1 | 3/2007 | Patel et al. |
| 2007/0080689 A1 | 4/2007 | Konijn et al. |
| 2007/0125107 A1 | 6/2007 | Beam |
| 2007/0146994 A1 | 6/2007 | Germagian et al. |
| 2007/0174024 A1* | 7/2007 | Rasmussen et al. ............. 703/1 |
| 2007/0213000 A1 | 9/2007 | Day |
| 2008/0080591 A1 | 4/2008 | Tanaka et al. |
| 2008/0269932 A1 | 10/2008 | Chardon et al. |
| 2010/0057259 A1 | 3/2010 | Dawson et al. |
| 2010/0094645 A1 | 4/2010 | Carroll et al. |

OTHER PUBLICATIONS

Tashtoush et al., Dynamic model of an HVAC system for control analysis, 2005, Elsevier, pp. 1729-1745.*

Moore et al., "ConSil: Low-Cost Thermal Mapping of Data Centers", Jun. 2006, HP White paper, 5 pages.

IBM, "Dynamic Thermal Mapping and Trend Analysis as a Control Mechanism for HVAC Systems in Data Centers", Mar. 27, 2006, 3 pages.

Notice of Allowance dated Aug. 19, 2011 in U.S. Appl. No. 12/240,016.

Alex Frangos; "Raised-Floor Ventilation Gains Footing in Offices"; URL: http://www.realestatejournal.com/propertyreport/office/20030714-frangos.html; pp. 1-2.

Kevin Epstein, et al.; "Double Jeopardy in a 'Slow' Disaster Computing Data Center Challenges in a Pandemic World"; URL: http://www.scalent.com/html/company/News/drj_spring07.pdf?item=21900; Spring 2006; pp. 50-51.

Ron Anderson; Increased power and cooling requirements are creating intensified demand for data-center redesigns; URL: http://i.cmpnet.com/v3.businessinnovation.cmp.com/pdfs/nwca_datacenter_report.pdf; Aug. 2006; pp. 1-24.

Mulay et al., "Computational Study of Hybrid Cooling Solution for Thermal Management of Data Center", 2007, Proceedings of IPACK2007, 9 pages.

Boucher et al., "Viability of Dynamic Cooling control in a Data Center Environment", IEEE, 2004, p. 593.

Karlsson et al., "Investigation of Indoor Climate and Power Usage in a Data Center", 2004, Elsevier, Linkoping University, Linkoping Sweden, pp. 1075-1083.

Booty-F, "Workplace Facilities", 2006, Facility Management Handbook, pp. 143-166.

Office Action dated Mar. 3, 2011 for corresponding U.S Appl. No. 12/240,016.

Notice of Allowance dated Nov. 7, 2014 in related U.S. Appl. No. 12/240,016, 7 pages.

Schmidt et al., "Challenges of Data Center Thermal Management" IEEE, 2005, 15 pages.

Final Office Action dated Oct. 29, 2013 in related U.S. Appl. No. 12/240,016, 33 pages.

Office Action dated Jul. 7, 2014 in related U.S. Appl. No. 12/240,016, 46 pages.

* cited by examiner

SYSTEM AND METHOD FOR DYNAMICALLY MODELING DATA CENTER PARTITIONS

CROSS REFERENCE TO RELATED APPLICATION

This application is related to U.S. Ser. No. 12/240,016 filed on the same day and currently pending.

FIELD OF THE INVENTION

The present invention generally relates to data centers, and more particularly, to a method and system implemented in a computer infrastructure to detect data center conditions and dynamically model the effect of physical partitions placed in a data center on the data center conditions.

BACKGROUND

A traditional data center conventionally includes a plurality of individual computing resources in one open area having four exterior walls. A data center (or other physical space) beneficially has, where possible, an optimized heating and cooling infrastructure. Maintaining data centers at desired temperatures (e.g., set points) helps prevent computer hardware (e.g., information technology (IT) infrastructure) from overheating and malfunctioning. To this end, many data centers are cooled to relatively low temperatures (e.g., 65° F.) to increase equipment reliability and useful life, and to avoid downtime for repair and/or replacement.

Current climate control systems are largely inefficient. The airflow of a data center is normally regulated by the amount of equipment and heat that is generated by the individual computing resources. Data centers typically have hot spots where IT equipment operates. That is, due to, e.g., the locations of the individual computing resources within the data center, there may be regions of higher temperatures and regions of cooler temperatures in the data center. However, conventional cooling systems cool the entire data center to a temperature well below the set point so that IT equipment operating in the hot spots does not exceed the set point. This increases operational costs and wastes energy.

Moreover, data center hot spots are routinely changing location, depending on which IT equipment is running at any given time. For example, some IT infrastructure in a first area of the data center may run during the day, while other IT infrastructure at a different area of the data center may operate at night. To accommodate such moving hot spot targets, existing systems resort to a sort of 'overkill' by cooling the entire volume of the data center to well below the set point, which increases operational costs. Moreover, with the increasing awareness and desire to operate in a green manner, such excessive use of energy is undesirable.

Furthermore, as, e.g., a rack of computers produce hot air, this hot air will normally be drawn to cooler temperature regions of the data center. This diffusion of the hot air to the cooler temperature regions of the data center adds to the load of cooling air that the heating, ventilation and air conditioning (HVAC) units must produce. Increasing the load on the HVAC units, in turn, increases the costs of operating the data center.

SUMMARY

In a first aspect of the invention, a method implemented in a computer infrastructure having computer executable code tangibly embodied on a computer readable medium having programming instructions operable to perform a thermal analysis of a data center and overlay the thermal analysis on a map of the data center to provide an overlaid thermal analysis. Additionally, the programming instructions are operable to receive a user selection of at least one modeled partition location based on the overlaid thermal analysis and dynamically model a modeled partition for each of the at least one modeled partition location in the data center to create a modeled data center region.

In another aspect of the invention, a system comprises a thermal analysis tool configured to perform a thermal analysis of a data center and a mapping tool configured to overlay the thermal analysis over a map of the data center to provide an overlaid thermal analysis. Additionally, the system comprises a partition and heating, ventilation and air conditioning (HVAC) modeling tool configured to receive a user selection of at least one modeled partition location based on the overlaid thermal analysis and dynamically model a modeled partition for each of the at least one modeled partition location in the data center to create a modeled data center region.

In an additional aspect of the invention, a computer program product comprising a computer usable medium having readable program code embodied in the medium is provided. The computer program product includes at least one component operable to perform a thermal analysis of a data center by receiving real-time temperature readings from at least one environmental sensor in the data center. Additionally, the at least one component is operable to at least one of determine average temperatures for regions of the data center based on the real-time temperature readings and determine air flow paths in the data center. Moreover, the at least one component is operable to overlay the thermal analysis on a map of the data center to provide an overlaid thermal analysis. Further, the at least one component is operable to receive a user selection of at least one modeled partition location based on the overlaid thermal analysis and dynamically model a modeled partition for each of the at least one modeled partition location in the data center to create a modeled data center region. Additionally, the at least one component is operable to dynamically model an HVAC system based on the overlaid thermal analysis and the at least one modeled partition location to provide a desired temperature in the modeled data center region.

In a further aspect of the invention, a method comprises providing a computer infrastructure operable to perform a thermal analysis of a data center to identify cooler regions of the data center and hotter regions of the data center. Furthermore, the computer infrastructure is operable to overlay the thermal analysis on a map of the data center to provide an overlaid thermal analysis which correlates the cooler regions of the data center and the hotter regions of the data center with computational resources of the data center. Additionally, the computer infrastructure is operable to receive a user selection of at least one modeled partition location based on the overlaid thermal analysis and dynamically model a modeled partition for each of the at least one modeled partition location in the data center to create a modeled data center region. Further, the computer infrastructure is operable to dynamically model an HVAC system based on the overlaid thermal analysis and the at least one modeled partition location to provide a desired temperature in the modeled data center region.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 1 shows an illustrative environment for implementing steps in accordance with the invention.

DETAILED DESCRIPTION

Figure 1:
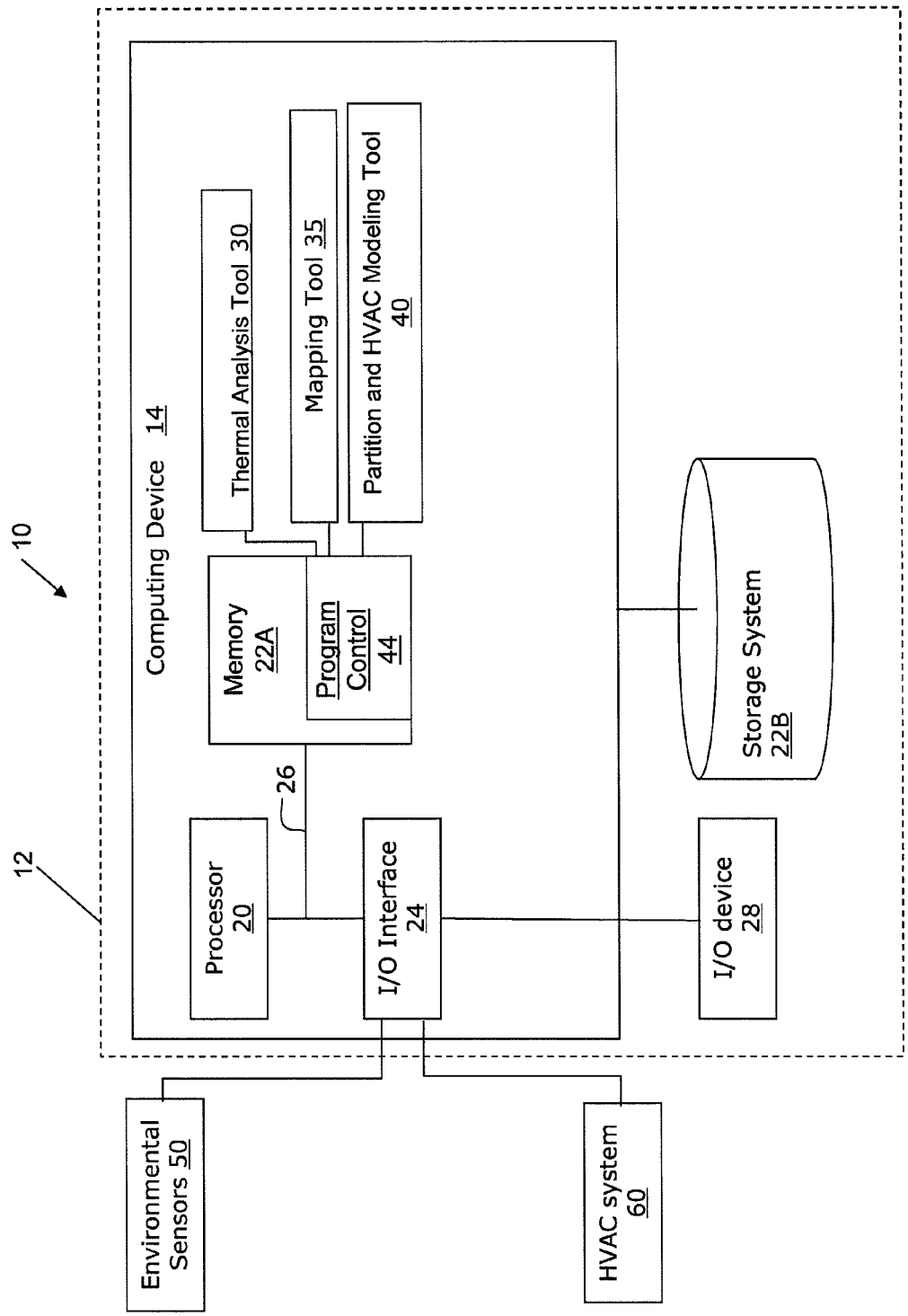

The present invention generally relates to data centers, and more particularly, to a method and system implemented in a computer infrastructure to detect data center conditions and dynamically model the effect of physical partitions placed in a data center on the data center conditions. The present invention is able to dynamically model an effect of modeled partitions within the data center between, for example, the walkways and the information technology (IT) infrastructure. Moreover, the modeling of the partitions may be used to determine where to place the partitions within the data center to, e.g., concentrate cooling capacity and air flow to an area of the data center where a job is scheduled and, e.g., close off areas of the data center not being utilized. For example, through reconfigurable walls, ceilings and/or partitions, the cooler air may be circulated between parts of the data center that require cooling, e.g., data center hot spots, and thereby reducing the strain on the HVAC units to produce cooler air for the entire data center. This will allow the data center to maximize cool air within the data center and shield the computing systems from hot air. This will also protect computing resources from dangerous hot spots by regulating the hot air within the data center to areas that may be controlled through the use of the dynamic walls, partitions and/or ceilings.

By implementing the present invention, modeling of the data center with partitions can be performed to achieve improved airflow and better managed temperature distributions within the data center. Moreover, by modeling the wall partitions to, e.g., maximize convective airflow through the data center, the data center can better utilize its power and cooling resources. Additionally, by modeling the placement of partitions and the effects thereof prior to actually placing the partitions in position within the data center, an actual placement of the partitions within the data center need not occur in order to determine the resulting data center conditions, and the energy used to place the partitions can be minimized. That is, according to an aspect of the invention, the partitions may not be placed within the data center until a modeling of their placement and the effect of their placement is performed. As such, multiple models (e.g., multiple variations of partition placement and/or HVAC control) may be created and examined before deciding which model (e.g., particular partition placement and/or HVAC control) is to be implemented.

By using a system of modeling the effects of dynamically configurable ceilings, walls and/or partitions, the energy efficiency of the data center will be improved to reduce the power and strain on cooling the air in certain parts of the data center. Additionally, implementing the present invention will reduce the amount of energy consumed by the data center HVAC system, thereby increasing the efficiency of the data center.

Furthermore, the present invention may lengthen the meantime to failure for critical systems that are affected by changes in heat, temperature and humidity.

System Environment

FIG. 1 shows an illustrative environment 10 for managing the processes in accordance with the invention. To this extent, the environment 10 includes a computer infrastructure 12 that can perform the processes described herein using a computing device 14. The computing device 14 includes a thermal analysis tool 30, a mapping tool 35, and a partition and heating, ventilation and air conditioning (HVAC) modeling tool 40. These tools are operable to perform a thermal analysis of a data center, overlay the thermal analysis over a map of the data center, model the placement of partitions based on the overlaid thermal analysis and model the HVAC system based on the overlaid thermal analysis, e.g., the processes described herein.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code in order to reduce the number of times code must be retrieved from bulk storage during execution.

Further, the computing device 14 is in communication with an external I/O device/resource 28. The I/O device 28 can interact with the computing device 14 or any device that enables the computing device 14 to communicate with one or more other computing devices using any type of communications link. The external I/O device/resource 28 may be keyboards, displays, pointing devices, etc. Additionally, in embodiments, the computing device 14 includes a storage system 22B. Moreover, as shown in FIG. 1 and explained further below, the computing device 14 is in communication with a plurality of environmental sensors 50 and, in embodiments, an HVAC system 60.

The processor 20 executes computer program code (e.g., program control 44) processes on computer media, which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

The computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 12 is only illustrative of various types of computer infrastructures for implementing the invention. For example, in embodiments, the computer infrastructure 12 comprises two or more computing devices (e.g., a server cluster) that communicate over any type of communications link, such as a network, a shared memory, or the like, to perform the processes described herein. Further, while performing the processes described herein, one or more computing devices in the computer infrastructure 12 can communicate with one or more other computing devices external to computer infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a service provider, such as a Solution Integrator, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

Thermal Analysis

According to an aspect of the invention, the thermal analysis tool 30 may be used to perform a thermal analysis of a data center. More specifically, a plurality of environmental sensors 50 may be located throughout the data center. In embodiments, the plurality of environmental sensors 50 may include indoor temperature sensors, outdoor temperature sensors, airflow sensors and humidity sensors, amongst other environmental sensors. Moreover, in embodiments, the environmental sensors 50 may be, for example, evenly spaced throughout the data center. Additionally, in embodiments, the environmental sensors 50 may be located in known data center hot spots. Moreover, in embodiments, the environmental sensors 50 may be located on the ceiling of the data center, the floor of the data center and/or the walls of the data center (e.g., at differing elevations in the walls of the data center).

The thermal analysis tool 30 may receive real-time environmental, e.g., temperature and/or humidity, readings from the plurality of environmental sensors 50. In embodiments, the thermal analysis tool 30 may determine average temperatures for regions of the data center based on the real-time temperature readings from the plurality of environmental sensors 50. Moreover, based on the real-time temperature readings, the thermal analysis tool 30 can determine a thermal analysis of the data center. For example, the thermal analysis tool 30 can determine regions of the data center that are very hot, e.g., regions having a number of currently operating computer resources, and regions of the data center that are very cool, e.g., regions in which no computer resources are currently operating. Moreover, the thermal analysis tool 30 can determine air flow paths, e.g., hot air flow paths, based on the real-time temperature readings from the plurality of environmental sensors 50. For example, the thermal analysis tool 30 can utilize the real-time temperature readings to determine, for example, upon activation of a computer resource, the flow path of hot air traveling from the computer resource in the data center. Additionally, the thermal analysis tool 30 may access a job schedule (e.g., stored in storage system 22B), such that the thermal analysis tool 30 is aware of scheduled jobs for the different computing resources of the data center.

According to aspects of the invention, the mapping tool 35 may overlay the thermal analysis results obtained from the thermal analysis tool 30 to a map of the data center, e.g., a floor plan view. In embodiments, the map of the data center may include a physical layout of the data center's computing resources, including the locations of computing resources in the data center, as well as an indication as to whether, for example, a portion of computing resources should be maintained in a cool environment and/or a portion of the computing resources can operate in higher temperature environments. Using the floor plan view with the overlaid thermal analysis, the mapping tool 35 can determine those regions of the data center that may benefit from the partitions.

Figure 2:
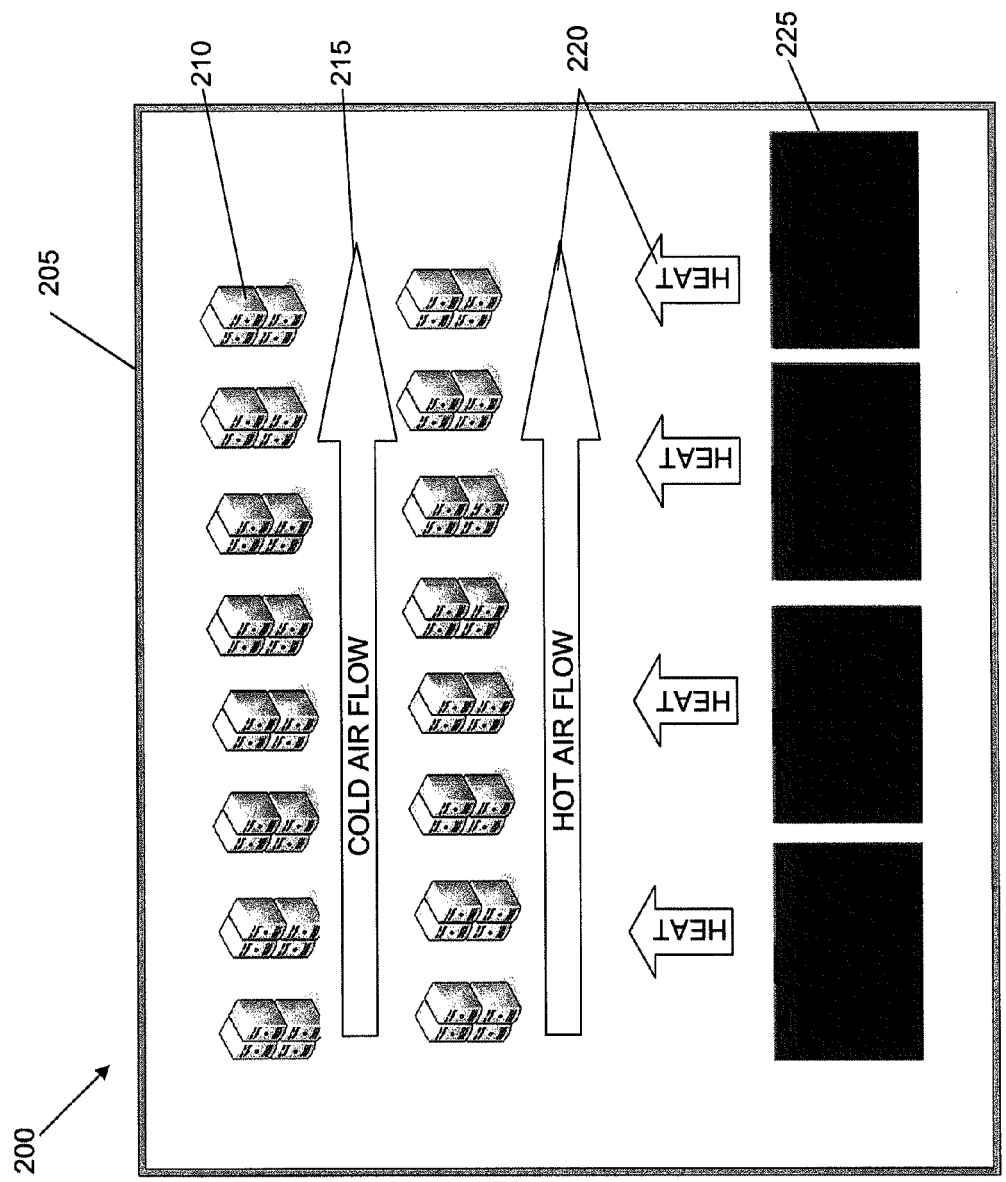
FIG. 2 shows an exemplary thermal analysis of a data center in accordance with the invention.

FIG. 2 shows an exemplary overlaid thermal analysis 200 according to an aspect of the invention. As shown in FIG. 2, a data center 205 contains, for example, computing equipment 210 that should be maintained at a cooler temperature and computing equipment 225 that may be less sensitive to higher temperatures. Additionally, using the mapping tool 35, FIG. 2 shows a thermal analysis overlaid over a map of the data center, such that the overlaid thermal analysis 200 indicates hot air flows 220 and cold air flow 215 within the data center 205. Moreover, as can be determined from the overlaid thermal analysis 200, the computing equipment 225 is generating heat 220 that is flowing towards computing equipment 210, which, e.g., should be maintained at cooler temperatures.

It should be understood that, in embodiments, in addition to (or as an alternative to) the mapping tool 35 utilizing a floor plan view of the data center 205 as explained above, the mapping tool 35 may utilize other views of the data center 205, e.g., an elevation plan, in providing the overlaid thermal analysis. Moreover, while the floor plan view may be especially useful for modeling the placement of vertical partitions, it should be understood that the elevation views may be especially useful for modeling the placement of horizontal partitions. That is, the mapping tool 35 may map a thermal analysis over an elevation view, such that cooler or hotter regions (detected by the thermal analysis tool 30) of the data center may identified relative to a vertical axis of the data center. Additionally, the partition and HVAC modeling tool 40 may use this overlaid thermal analysis to model a horizontal partition e.g., a dropped ceiling partition or a raised floor partition, to, for example, model adjusted air flow patterns in the data center.

Partition and HVAC Modeling

According to further aspects of the invention, the partition and HVAC modeling tool 40 may utilize the overlaid thermal analysis 200 to model one or more locations for data center partitions, such that, for example, those regions of the data center that should be maintained at a cooler temperature may be thermally separated from those regions of the data center that, e.g., may require less cooling.

Additionally, according to aspects of the invention, a user may instruct the partition and HVAC modeling tool 40, based on the overlaid thermal analysis 200, to dynamically model one or more partitions, such that, for example, the modeled airflow can be dynamically changed to, e.g., shield computing resources from hot-spots within the data center. For example, the overlaid thermal analysis 200 may indicate that by enclosing or semi-enclosing the computing resources with the partitions, the efficiency of the HVAC units will be improved overall and the temperatures in the data center may be better controlled. Accordingly, a user may use the overlaid thermal analysis 200 to determine an area in the data center that may benefit from the placement of partitions. Additionally, the user may instruct the partition and HVAC modeling tool 40 to model one or more partitions to, for example enclose the area in the data center that may benefit from the placement of the partitions.

Figure 3:
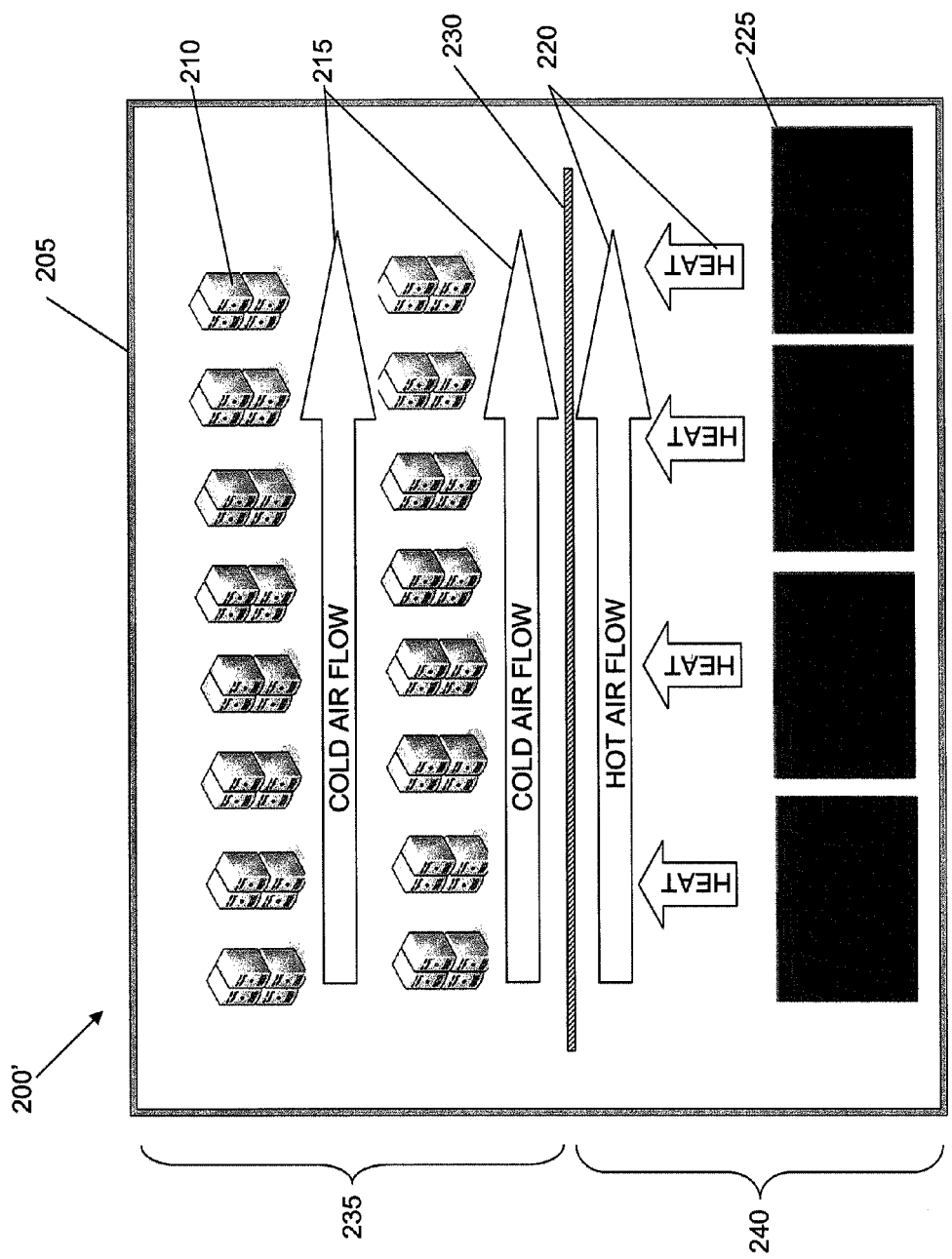
FIG. 3 shows an exemplary modeled thermal analysis of a data center in accordance with the present invention.

FIG. 3 shows an exemplary modeled thermal analysis 200' according to aspects of the invention. More specifically, FIG. 3 illustrates a modeled thermal analysis 200' of the data center 205 of FIG. 2, which includes a modeled partition 230 in the data center to dynamically change the data center airflow. As shown in FIG. 3, with the modeled thermal analysis 200', the modeled data center airflow has been changed due to the modeled partition 230. In embodiments, for example, the modeled thermal analysis 200' may be displayed on an I/O device 28 (e.g., a display) via I/O interface 24 of FIG. 1, such that, for example, a data center employee may observe the effects of the modeling and select an actual configuration of partitions in the data center and the HVAC system parameters for the data center.

More specifically, in the modeled thermal analysis 200' those computing devices 210 which should be maintained at a cooler temperature have been isolated from those computing devices 225 that are less susceptible to higher temperatures. As such, with the modeled thermal analysis 200' the modeled hot air flow 220 produced by the computing devices 225 is contained within a hotter region 240 of the data center 205 and does not flow to the cooler region 235 of the data center 205. Moreover, the modeled cold air flow 215 is now restricted to the cooler region of the data center. Thus, as shown in FIG. 3, the partitions may provide a two-fold advantage. First, the hot air flow 220 is restricted to the hot region 240 of the data center 205, such that the hot air flow 220 does not increase temperatures in the cool region 235 of the data center 205. As the hot air flow 220 does not increase temperatures in the cool region 235, a load on the HVAC system is reduced. Moreover, a load on the HVAC system is also reduced, as the HVAC system is producing a cold air flow 215 to cool a smaller volume of the data center, e.g., the cool region 235.

In embodiments, the partitions may comprise a plurality of dynamically reconfigurable drop-down partitions, ceilings and floors. That is, while the exemplary modeled partition 230 as shown in FIG. 3 is a single vertical partition, the invention contemplates that the modeled partition may be a plurality of modeled partitions. Further, the invention contemplates that the modeled partition may also be a horizontal partition, e.g., a dropped ceiling partition and/or a raised floor partition, or may be arranged at some angle between the horizontal and the vertical, depending on the configuration of the data center 205.

The materials of the partition should be selected to provide thermal insulation properties to the partition. For example, the partition may comprise a plurality of thermal tiles that, e.g., reflect and/or absorb heat. Additionally, in embodiments, the partition may comprise a thermal cloth or fabric. Moreover, depending on embodiments, the materials of the partition may be flexible, such that the partition may be rolled-up. Accordingly, the modeled partition should reflect the thermal properties of the actual partition in use in the data center. That is, the modeled partition should have the same attributes (e.g., size, materials, orientation, and thermal or insulative properties (e.g., partition material R value), amongst other attributes) as an actual partition in order to provide an accurate modeled thermal analysis. As should be understood, an R value is a measure of thermal resistance, wherein a larger R value indicates more effective insulation properties.

Moreover, while the exemplary modeled partition 230 as shown in FIG. 3 does not traverse the entire distance between the walls of the data center 205, it should be understood that, in embodiments, the modeled partition may extend the entire distance between the walls of the data center 205. Moreover, while FIG. 3 only shows a single modeled partition 230, the invention contemplates that any number of modeled partitions may be used to, e.g., compartmentalize the data center 205, depending on a number of factors, including the thermal analysis of the data center, the size of the data center, the number of high-temperature sensitive computing resources in the data center, the locations of the high-temperature sensitive computing resources within the data center, the number of non-high-temperature sensitive computing resources, the locations of the non-high-temperature sensitive computing resources within the data center, the real-time load on the data center 205, a job schedule for the data center, and the time of day, amongst other factors. As such, any number of modeled partitions may be used to model their effect in the data center.

According to aspects of the invention, the partition and HVAC modeling tool 40 may model a data center HVAC system 60 based on the determined thermal analysis and the user-determined locations of the modeled partitions. For example, after modeling a partition in the data center, the partition and HVAC modeling tool 40 may dynamically model air flow properties of the supplied air to different regions of the data center. More specifically, the partition and HVAC modeling tool 40 may dynamically model air flow properties of the supplied air to different regions of the data center by, for example, selectively increasing or decreasing modeled air flow rates to different regions of the data center, selectively increasing or decreasing modeled air flow temperatures for different regions of the data center, selectively turning on or off modeled air flows to different regions of the data center and/or selectively varying diffuser positions, orientations and/or degrees of opening.

It should be understood that a data center HVAC system includes duct work, multiple air supply vents and diffusers. Additionally, it should be understood that the HVAC duct work, multiple air supply vents and diffusers may be in the ceiling of the data center, the walls of the data center (e.g., at different elevations on the walls) and/or the floors of the data center (e.g., within a sub floor wiring layer). Moreover, the data center may include environmental sensors 50 throughout the data center. Additionally, as discussed above, in embodiments, the environmental sensors 50 (e.g., thermometers) may be regularly-spaced throughout the data center or randomly-spaced throughout the data center to sense temperature and provide this information to the thermal analysis tool 30.

Furthermore, as discussed above, the data center may include computer resources that are to be maintained in a cooler environment and computer resources that can operate in higher temperature environments. Accordingly, the data center may have regions that should be maintained at cooler temperatures (for the computer resources that are to be maintained in a cooler environment) and may have regions that may not need as much cooling (for the computer resources that can operate in higher temperature environments).

Thus, referring to FIG. 3, in embodiments, the partition and HVAC modeling tool 40 may model an HVAC system 60 (shown in FIG. 1) of the data center, for example, to only supply the cold air flow 215 to the cooler region 235 of the data center 205, while cutting off a supply of cold air flow to the hotter region 240. Additionally, in embodiments, the partition and HVAC modeling tool 40 may model the HVAC system 60, for example, to supply the cold air flow 215 to the cooler region 235 of the data center 205, while restricting a supply of cold air flow to the hotter region 240 to, e.g., twenty-five percent of the flow supplied to the cooler region 235. Moreover, in embodiments, the partition and HVAC modeling tool 40 may model restricted or cut-off flow using the duct work, air supply vents and/or diffusers. For example, the partition and HVAC modeling tool 40 may model the air supply vents, such that the air supply vents may be selectively fully-opened, fully-closed or anywhere between the fully-opened and fully-closed positions.

Additionally, in embodiments, the HVAC system 60 may be capable of concurrently supplying air of differing temperatures to the data center. For example, the HVAC system 60 may comprise a plurality of individually-controllable air conditioning units. Accordingly, the partition and HVAC modeling tool 40 may, for example, model the HVAC system 60 to supply cooling air at different temperatures to the different regions (e.g., as a result of the modeled placement of partitions) of the data center 205. For example, referring to FIG. 3, the partition and HVAC modeling tool 40 may model the HVAC system 60 to supply air at a temperature of, e.g., 60° F. to the cooler region 235 and supply air at a temperature of, e.g., 80° F. to the hotter region 240.

Partition and HVAC Modeling Parameters

According to an aspect of the invention, the partition and HVAC modeling tool 40 may utilize a number of parameters in determining a modeling of the data center. In embodiments, these parameters may include a volume created by placement of the modeled partitions, partition material R value, ceiling tile R value, floor R value, the amount of air conditioning tonnage within the volume, the placement of diffusers within the volume, the heat-generating characteristics of the IT equipment within the volume, and the job schedule for the IT equipment within the volume. In embodiments, the heat-generating characteristics of the IT equipment and the job schedule for the IT equipment may be stored in a database, e.g., within storage system 22B. That is, while some of the parameters may be dependant upon the placement of the modeled partitions, the heat-generating characteristics of the IT and the job schedule for the IT equipment may be independent of the modeled placement of the partitions.

Figure 4:
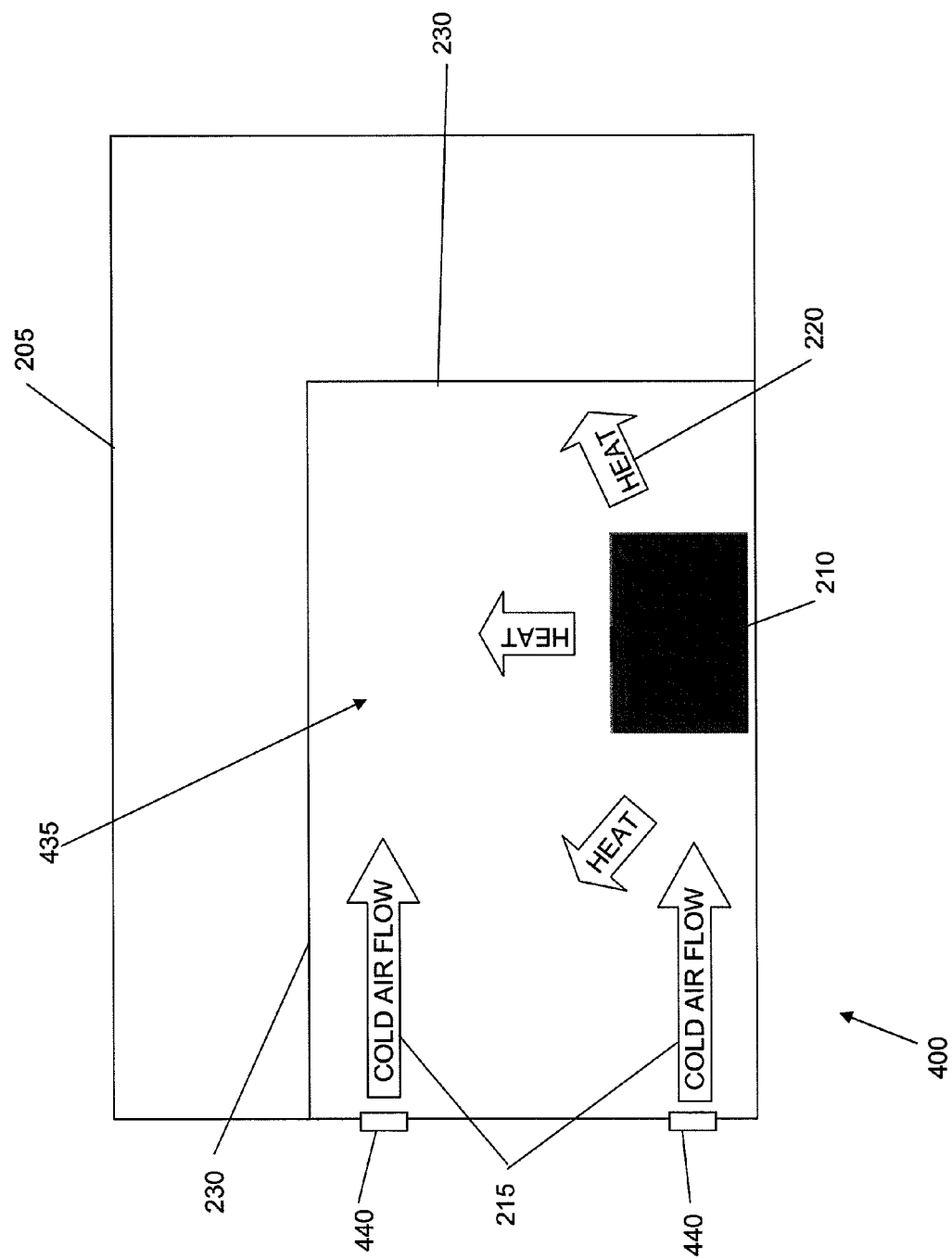
FIG. 4 shows an exemplary illustration of parameters for determining modeled partition placement and modeled HVAC system control in accordance with the present invention.

FIG. 4 shows an exemplary depiction of parameters that may be used to determine a modeled partition placement and HVAC control in accordance with aspects of the present invention. As shown in FIG. 4, a modeled data center 205 includes two modeled partitions 230 (e.g., a horizontal modeled partition and a vertical modeled partition). The modeled partitions 230 create a smaller data center region 435 of the data center 205 in which, with this example, a computing device 210 is located. While two modeled partitions 230 and only a single computing device 210 are shown in FIG. 4, it should be understood that any number of modeled partitions 230 may be used to, e.g., isolate any number of computing devices 210. As additionally shown in FIG. 4, the computing device generates heat 220 within the data center region 435. Furthermore, two diffusers 440 of an HVAC system 60 output a cold air flow 215 into the data center region 435.

According to an aspect of the invention, the partition and HVAC modeling tool 40 may model the placement of one or more partitions based on user selection, and utilize the above-noted parameters to model the HVAC system settings. In one non-limiting embodiment, the partition and HVAC modeling tool 40 may utilize the thermal analysis and overlaid thermal analysis to identify an area of the data center 205 that may benefit from a partition. A user may select placements for one or more partitions and the partition and HVAC modeling tool 40 may then model one or more partitions 230 placed in the data center to, e.g., model an enclosed smaller data center region 435 that may benefit from the partition. Additionally, the partition and HVAC modeling tool 40 may determine a volume of the modeled data center region 435.

Furthermore, the partition and HVAC modeling tool 40 may determine a current temperature (e.g., average temperature) of the modeled data center region 435 via the environmental sensors 50, and the desired temperature of the modeled data center region 435. In embodiments, the partition and HVAC modeling tool 40 may determine the desired temperature of the modeled data center region 435 based upon the environmental requirements (e.g., a operating environment temperature) of the IT equipment 210 within the data center region 435 and, in embodiments, the scheduled work load or current work load of the IT equipment 210. The environmental requirements for the IT equipment 210 and/or the IT equipment scheduled work load may be stored in a database, e.g., storage system 22B of FIG. 1.

According to a further aspect of the invention, the partition and HVAC modeling tool 40 may utilize the determined volume of the modeled data center region 435 and the environmental requirements of the IT equipment within the data center region 435 to model the HVAC system settings. For example, the partition and HVAC modeling tool 40 may model an amount of air conditioning (AC) tonnage, a number of HVAC units, an HVAC flow rate and/or an HVAC flow temperature required to maintain the data center region 435 at the desired temperature. Moreover, the partition and HVAC modeling tool 40 may model, for example, a number, the placement, the orientation and a degree of opening of diffusers, amongst other parameters, that may be required to maintain the data center region 435 at the desired temperature.

As should be understood, the partition and HVAC modeling tool 40 should model the HVAC system so that the heat generated by the computing device 210 within the volume of the data center region 435 is thermodynamically balanced with the cooling capacity of the HVAC system to maintain the data center region 435 at the desired temperature. That is, the computing device 210 will output an amount of heat energy into the data center region. In embodiments, the amount of thermal energy produced by the computing device 210 may be quantified (e.g., through testing) and stored in a database, e.g., storage system 22B. Additionally, the amount of thermal energy produced by the computing device 210 may be inferred from the detected environmental conditions (e.g., temperature) of the data center region 435.

In embodiments, the HVAC system 60 can produce a quantifiable amount of cooling capacity for a given volume. The HVAC system cooling capacity information may be stored in a database, e.g., storage system 22B. The given volume is defined by the modeled data center region created using the modeled partition(s) 230. Therefore, according to aspects of the invention, the amount of cooling provided by the HVAC system may be modeled to counteract the heating provided by the computing device 210, and to maintain the data center region 435 at the desired temperature. Additionally, actual partitions used in the data center may not be completely insulative. That is, thermal energy (e.g., heating or cooling energy) may not be completely contained within a data center region defined at least in part by partitions. Thus, in embodiments, the partition and HVAC modeling tool 40 may account for any thermal inefficiency of the partitions, e.g., any loss of energy through the modeled partitions 230, when determining an amount of cooling capacity necessary to maintain the modeled data center region 435 at the desired temperature.

Thus, referring to FIG. 4, as shown in the exemplary modeled data center 400, the partition and HVAC modeling tool 40 has modeled two partitions 230 in the data center 205 based on user selection. Moreover, the partition and HVAC modeling tool 40 has determined that in order to maintain the modeled data center region 435 of the data center 205 at the desired temperature, two diffusers 440 may be modeled at particular positions (e.g., elevations) within the modeled data center region 435 and the HVAC system may be modeled to provide, e.g., a certain air flow rate and air flow temperature to provide a particular amount of cooling. Thus, it should be understood that the partition and HVAC modeling tool 40 may model a number of parameters of the HVAC system, including a number of air conditioner units, an air flow temperature, an air conditioning tonnage, an air flow rate, a location of diffusers, an orientation of diffusers (e.g., downwardly-directed or upwardly-directed, amongst other orientations).

While the example of FIG. 4 shows only a single modeled data center 400, it should be understood that a plurality of data center models may be created for the same data center and/or the same modeled data center region 435. That is, for a particular data center condition, e.g. a computing device 210 operating in a region of the data center 205, the partition and HVAC modeling tool 40 may create plurality of different modeled partition orientations based on user selection and corresponding modeled HVAC parameters. Moreover, the partition and HVAC modeling tool 40 may create plurality of modeled HVAC parameters for the same modeled data center region 435 defined by the modeled partition(s) 210.

Dynamic Modeling of Partitions and HVAC System

The invention contemplates that the temperature distributions may change within the data center dynamically. For example, during the middle of the day, due to, e.g., heat from the sun, conditions may change within the data center. Additionally, computational loads on the computing resources in the data center may change, thus altering, for example, the amount of heat generated by the computing resources, and consequently, a previously determined overlaid thermal analysis.

As such, according to aspects of the invention, the thermal analysis tool 30 may perform updates to the thermal analysis and the mapping tool 35 may update the overlaid thermal analysis. For example, the thermal analysis tool 30 may perform the thermal analysis at a predetermined regular interval, e.g., every hour. It should be understood that the predetermined regular interval may be user configurable. Moreover, the partition and HVAC modeling tool 40 may dynamically model the data center to account for the dynamically changing thermal conditions of the data center. Further, in embodiments, the partition and HVAC modeling tool 40 may operate in real-time to dynamically model the data center based on current data center conditions.

Additionally, a triggering event may occur, wherein conditions in the data center may trigger an updated thermal analysis by the thermal analysis tool 30, and subsequently, may trigger the partition and HVAC modeling tool 40 to request new partition placement selections from a user and provide a new model for the partitions and/or HVAC control. For example, an environmental sensor 50 in the data center may sense a sudden change in temperature in a particular region of the data center. The thermal analysis tool 30 may detect the sudden change in temperature in a particular region of the data center, and consequently, trigger an update of the thermal analysis. Additionally, the partition and HVAC modeling tool 40 may request, signal or allow a user to reconfigure the placement of the modeled partitions based on the update of the thermal analysis. Accordingly, the partition and HVAC modeling tool 40 may update the modeled partition placement and/or HVAC control via the partition and HVAC modeling tool 40. In embodiments, an updated thermal analysis may be triggered by a change in temperature beyond a predetermined threshold, e.g., five degrees Fahrenheit or ten percent. Moreover, it should be understood that the predetermined threshold may be user-configurable.

Furthermore, a change in load, e.g., an increase in load, on the computing devices may trigger an updated thermal analysis. For example, in embodiments, the thermal analysis tool 30 may be configured to additionally detect real-time computational loads on the computing devices of the data center. Thus, according to aspects of the invention, if the thermal analysis tool 30 detects a computational load increase, e.g., beyond a predetermined threshold, this may trigger an updated thermal analysis and updated data center modeling. That is, with an increase in computational loads on the computing devices of the data center, the thermal energy produced by the computing device may likewise increase. Thus, an increase in computational loads on the computing devices of the data center may necessitate, for example, new models providing increased cooling in the data center and/or an additional partition, e.g., to section off a portion of the data center containing those computing devices that are now experiencing the increased computational loads.

Moreover, in embodiments, an updated thermal analysis and data center modeling may be manually directed. For example, a data center employee may perceive, e.g., an increase in temperature in a region of the data center. Accordingly, the employee may manually direct an updated thermal analysis and updated modeled partition placement and/or HVAC control. As a further example, a data center employee may run an unscheduled job on computing devices of the data center. As the job is unscheduled, the thermal analysis tool 30 may initially be unaware of the impending increased computational load. However, the data center employee may know, e.g., based on the size of the impending unscheduled job, that running the job will alter the previous thermal analysis of the data center. Accordingly, the data center employee may manually direct an updated thermal analysis and update the data center modeling to account for the unscheduled job.

Flow Diagram

Figure 5:
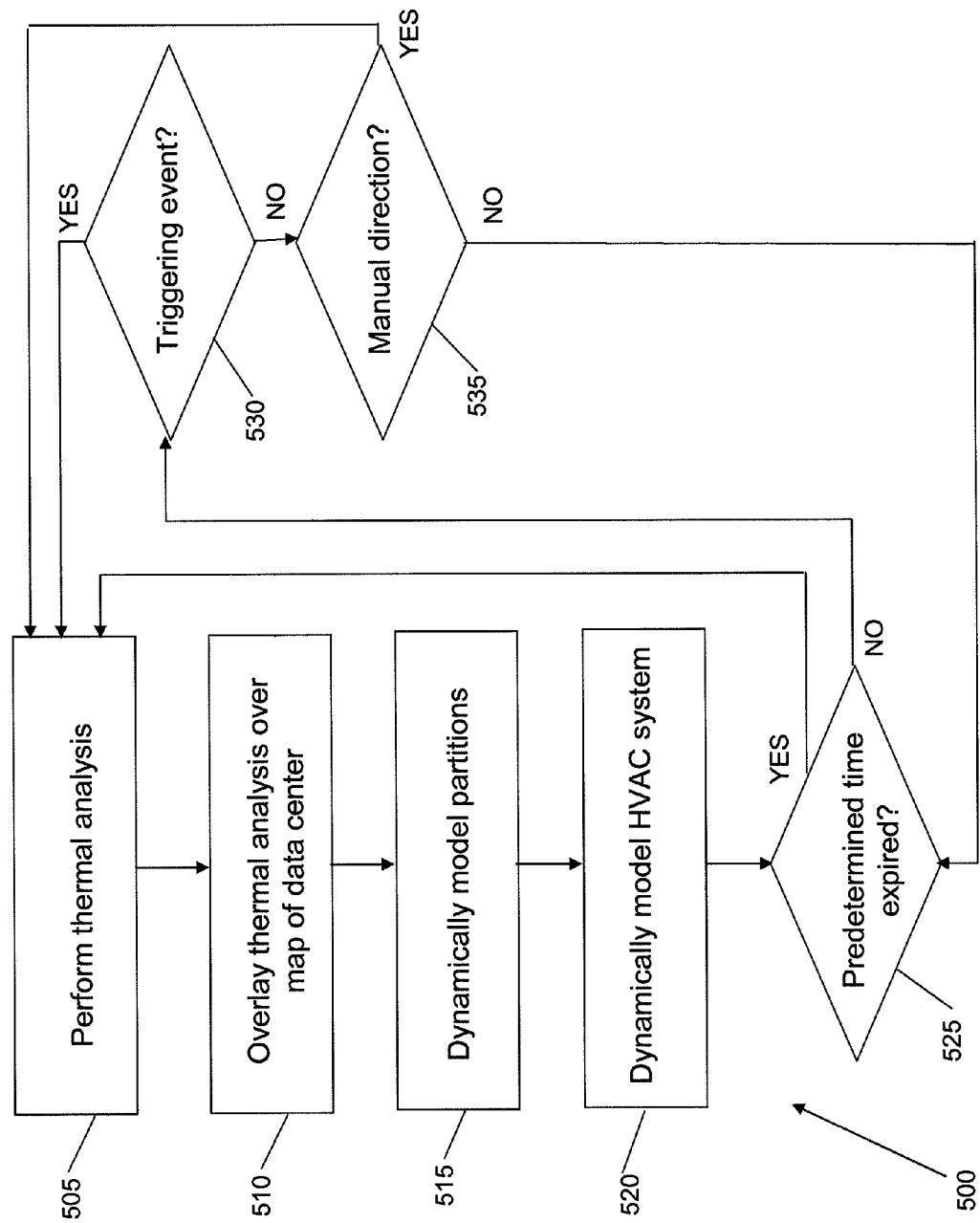
FIGS. 5 and 6 show flow diagrams for implementing aspects of the present invention.
Figure 6:
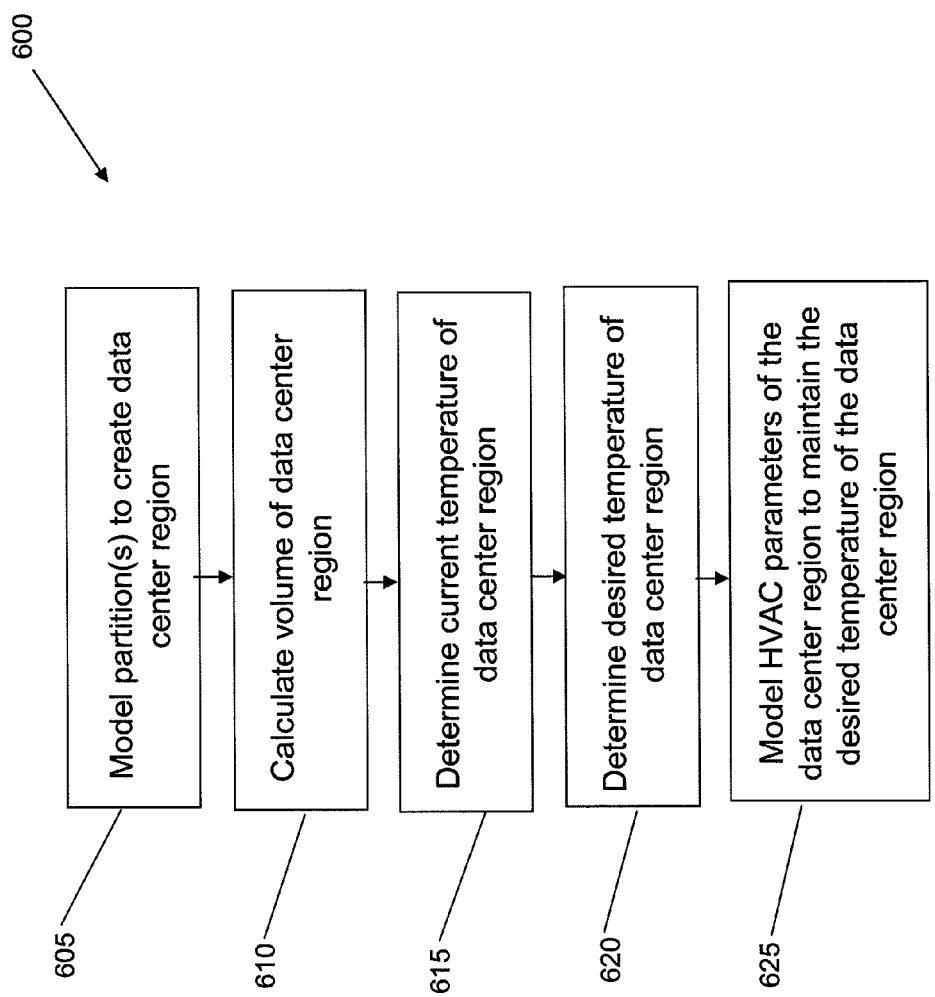

FIGS. 5 and 6 show exemplary flows for performing steps of the invention. The steps of FIGS. 5 and 6 may be implemented in the environment of FIG. 1, for example. The flow diagrams may equally represent high-level block diagrams of the invention. The flowchart and/or block diagram in FIGS. 5 and 6 illustrate the architecture, functionality, and operation of possible implementations of systems, methods and computer program products according to various embodiments of the present invention. In this regard, each block in the flowchart or block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the flowchart, and combinations of the flowchart illustrations can be implemented by special purpose hardware-based systems that perform the specified functions or acts, or combinations of special purpose hardware and computer instructions and/or software, as described above. Moreover, the steps of the flow diagrams may be implemented and executed from either a server, in a client server relationship, or they may run on a user workstation with operative information conveyed to the user workstation. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 5 shows an exemplary flow 500 for dynamically modeling data center partitions and HVAC parameters in accordance with aspects of the invention. As shown in FIG. 5, at step 505 the thermal analysis tool performs a thermal analysis of the data center to determine the hot and cold regions of the data center. At step 510, the mapping tool overlays or transposes the thermal analysis over a map or physical layout of the data center's computing resources. At step 515, using this information about the physical layout (which includes, e.g., information as to which computing resources are to be maintained in a cool environment and which computing resources are to be operate in a hotter environment, as described above) and the data center thermal analysis, a user may instruct the partition and HVAC modeling tool to dynamically model partitions (e.g., walls, ceilings and/or floors) to segment the hot spots from the colder regions of the data center. At step 520, the partition and HVAC modeling tool dynamically models the HVAC system to model, e.g., flow rates and/or flow temperatures of the cold air flow.

At step 525, the thermal analysis tool determines if a predetermined time, e.g., a user-configurable regular interval, has expired. If, at step 525, the thermal analysis tool determines that the predetermined time has expired, then the process continues at step 505, where another thermal analysis is performed, followed by an updated modeled thermal analysis. A new or updated modeled thermal analysis can be performed according to a new user-selected modeled configuration of the partitions of the data center and/or new modeled HVAC system parameters.

If, at step 525, the thermal analysis tool determines that the predetermined time has not expired, then at step 530, the thermal analysis tool determines if a triggering event has occurred. If, at step 530, the thermal analysis tool determines that a triggering event has occurred, then the process continues at step 505, where another thermal analysis is performed, followed by an updated modeled thermal analysis. In embodiments, a triggering event may include, for example, a temperature change in the data center beyond a predetermined threshold or a computational resource usage change in the data center.

If, at step 530, the thermal analysis tool determines that a triggering event has not occurred, then at step 535, the thermal analysis tool determines whether there has been a manual direction for an updated thermal analysis and modeling. If, at step 535, the thermal analysis tool determines that a manual direction has occurred, then the process continues at step 505, where another thermal analysis is performed, followed by an updated modeled thermal analysis. If, at step 535, the thermal analysis tool determines that a manual direction has not occurred, then the process continues at step 525.

It should be understood, that while the steps have been described as occurring in a particular order, the invention contemplates that the steps may be performed in other orders. For example, step 530 may occur after step 535. Furthermore, the invention contemplates that, in embodiments, steps may be implied or omitted while still remaining true to this invention.

Moreover, while the invention has been described using the thermal analysis tool 30, the mapping tool 35, and the partition and HVAC modeling tool 40, the invention contemplates that any of the operations performed by the thermal analysis tool 30, the mapping tool 35, and the partition and HVAC modeling tool 40 may be combined into one as a combination of different tools depending on programming logic, or may be performed manually by a user (e.g., a data center employee). For example, in embodiments, a data center employee may manually overlay or transpose the thermal analysis over a map or physical layout of the data center's computing resources.

FIG. 6 shows an exemplary flow 600 for modeling partitions and/or HVAC system parameters in accordance with aspects of the invention. As shown in FIG. 6, at step 605, the partition and HVAC modeling tool models one or more partitions to create a modeled data center region based on a user selection of partition placement locations. At step 610, the partition and HVAC modeling tool calculates a volume of the modeled data center region. At step 615, the thermal analysis tool determines a current temperature of the modeled data center region via the environmental sensors. At step 620, the partition and HVAC modeling tool determines a desired temperature of the modeled data center region, for example, via accessing a database containing IT equipment operating requirements and/or an IT equipment job processing schedule. At step 625, the partition and HVAC modeling tool models HVAC parameters of the data center region necessary to maintain the desired temperature of the data center region.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method implemented in a computer infrastructure, comprising computer implemented steps of: performing a thermal analysis of a data center;
   overlaying the thermal analysis on a map of the data center to provide an overlaid thermal analysis;
   receiving a user selection of at least one modeled partition location based on the overlaid thermal analysis; and
   dynamically modeling a modeled partition for each of the at least one modeled partition location in the data center to create a modeled data center region,
   dynamically modeling a heating, ventilation and air conditioning (HVAC) system based on the overlaid thermal analysis and the at least one modeled partition location to provide a desired temperature in the modeled data center region,
   and updating at least one of the performing, the overlaying, the receiving and the modeling after a predetermined time has expired.

2. A method implemented in a computer infrastructure, comprising computer implemented steps of:
   performing a thermal analysis of a data center;
   overlaying the thermal analysis on a map of the data center to provide an overlaid thermal analysis;
   receiving a user selection of at least one modeled partition location based on the overlaid thermal analysis; and
   dynamically modeling a modeled partition for each of the at least one modeled partition location in the data center to create a modeled data center region,
   wherein:
   the at least one modeled partition location comprises a location of at least one vertical or at least one horizontal partition;
   the map of the data center includes an elevation plan of the data center;
   the thermal analysis is overlaid on the elevation plan such that cool or hot regions of the data center are identified relative to a vertical axis of the data center; and
   the dynamically modeling comprises modeling at least one vertical or at least one horizontal partition at the location of the at least one vertical or the at least one horizontal partition to display airflow patterns relative to the vertical axis of the data center.

* * * * *